(12) United States Patent
Takayanagi

(10) Patent No.: US 7,696,585 B2
(45) Date of Patent: Apr. 13, 2010

(54) SEMICONDUCTOR DEVICE AND MANUFACTURING METHOD OF SEMICONDUCTOR DEVICE

(75) Inventor: Mariko Takayanagi, New York, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 109 days.

(21) Appl. No.: 11/933,845

(22) Filed: Nov. 1, 2007

(65) Prior Publication Data

US 2008/0203498 A1    Aug. 28, 2008

(30) Foreign Application Priority Data

Nov. 1, 2006   (JP) .............. 2006-297618

(51) Int. Cl.
*H01L 29/76* (2006.01)
(52) U.S. Cl. .............. 257/412; 257/E21.623; 257/E21.637
(58) Field of Classification Search ........... 257/369, 257/412, E29.161, E21.623, E21.637
See application file for complete search history.

(56) References Cited

U.S. PATENT DOCUMENTS

| | | | |
|---|---|---|---|
| 6,924,536 B2 | 8/2005 | Nishiyama et al. | |
| 7,265,428 B2 * | 9/2007 | Aoyama | 257/413 |
| 2005/0167766 A1 | 8/2005 | Yagishita | |
| 2006/0081947 A1 | 4/2006 | Mimura | |
| 2006/0180870 A1 * | 8/2006 | Ichihara et al. | 257/371 |
| 2006/0208320 A1 | 9/2006 | Tsuchiya et al. | |
| 2007/0120204 A1 | 5/2007 | Yagishita | |
| 2008/0122011 A1 * | 5/2008 | Wu | 257/392 |

FOREIGN PATENT DOCUMENTS

JP    2005-209782    8/2005

* cited by examiner

*Primary Examiner*—David Vu
(74) *Attorney, Agent, or Firm*—Oblon, Spivak, McClelland, Maier & Neustadt, L.L.P.

(57) ABSTRACT

In one aspect of the present invention, a semiconductor device may include a semiconductor substrate; a first gate dielectric layer provided on the semiconductor substrate, the relative dielectric constant ratio of the first gate dielectric layer being no less than 8; a second gate dielectric layer provided on the semiconductor substrate, the relative dielectric constant ratio of the second gate dielectric layer being no less than 8; a first gate electrode provided on the first gate dielectric layer and made of germanide which is a metallic compound containing a metal element of a rare earth metal; and a second gate electrode provided on the second gate dielectric layer and made of silicide which is a metallic compound containing the same metal element of a rare earth metal as the germanide in the first gate electrode.

6 Claims, 15 Drawing Sheets

17 絶縁層

US 7,696,585 B2

SEMICONDUCTOR DEVICE AND MANUFACTURING METHOD OF SEMICONDUCTOR DEVICE

CROSS REFERENCE TO RELATED APPLICATION

This application is based upon and claims the benefit of priority from Japanese Patent Application No. 2006-297618, filed on Nov. 1, 2006, the entire contents of which are incorporated herein by reference.

BACKGROUND

In a conventional semiconductor device, an Er silicide is used as a gate electrode of an n-MOSFET (Metal Oxide semiconductor Field Effect Transistor) and a Pt silicide is used as a gate electrode of a p-MOSFET.

The Er silicide has an effective work function, which is lower than the middle of the band gap of Si, and the Pt silicide has an effective work function, which is higher than the middle of the band gap of Si.

However, the various metals (Er and Pt) are used in the gate electrodes in single semiconductor device. So, the manufacturing process may be complicated and through put may be worsened.

SUMMARY

Aspects of the invention relate to an improved semiconductor device.

In one aspect of the present invention, a semiconductor device may include a semiconductor substrate; a first gate dielectric layer provided on the semiconductor substrate, the relative dielectric constant ratio of the first gate dielectric layer being no less than 8; a second gate dielectric layer provided on the semiconductor substrate, the relative dielectric constant ratio of the second gate dielectric layer being no less than 8; a first gate electrode provided on the first gate dielectric layer and made of germanide which is a metallic compound containing a metal element of a rare earth metal; and a second gate electrode provided on the second gate dielectric layer and made of silicide which is a metallic compound containing the same metal element of a rare earth metal as the germanide in the first gate electrode.

BRIEF DESCRIPTIONS OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION

Figure 1:
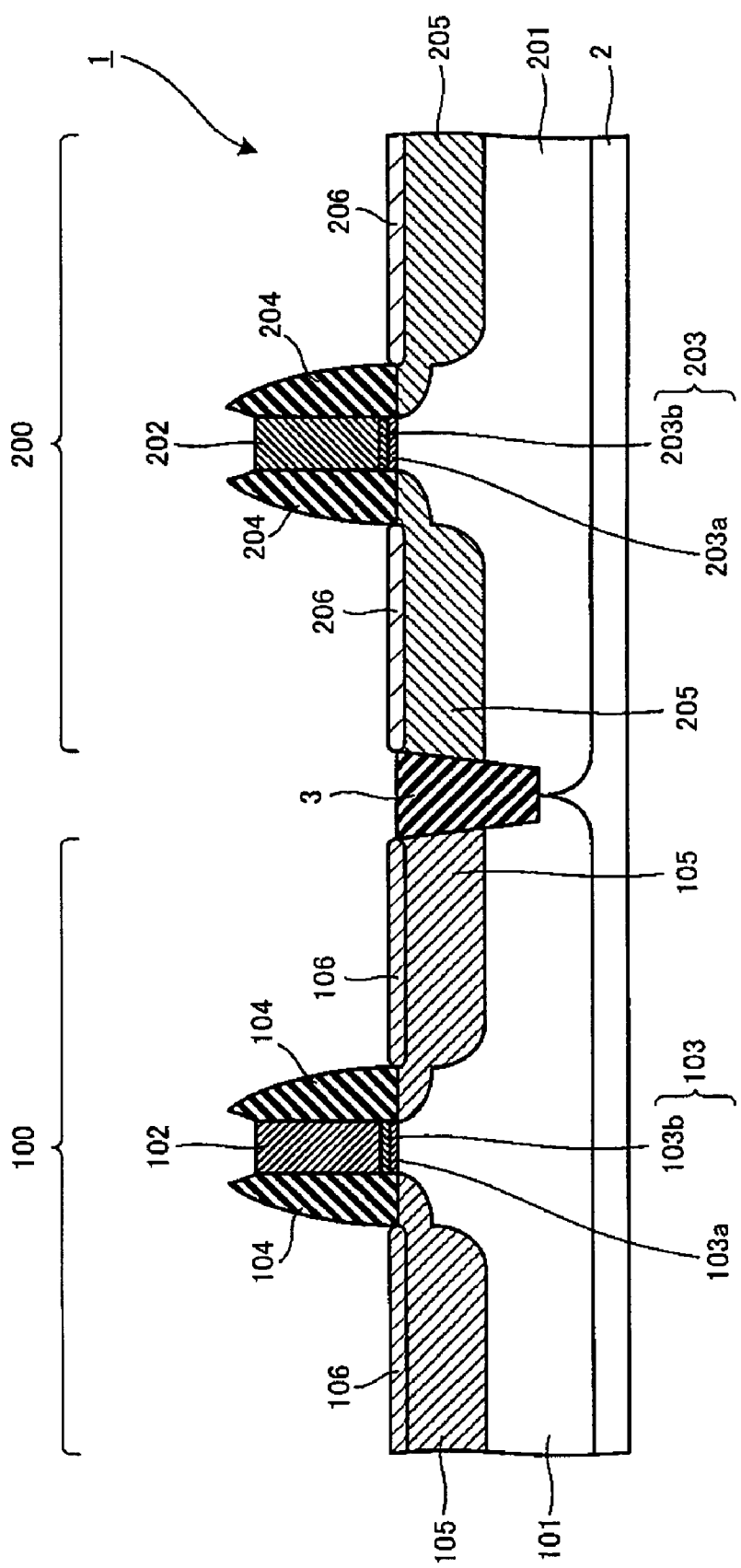
FIG. 1 is a cross sectional view of a semiconductor device in accordance with a first embodiment.

Various connections between elements are hereinafter described. It is noted that these connections are illustrated in general and, unless specified otherwise, may be direct or indirect and that this specification is not intended to be limiting in this respect.

Embodiments of the present invention will be explained with reference to the drawings as next described, wherein like reference numerals designate identical or corresponding parts throughout the several views.

First Embodiment

A first embodiment of the present invention will be explained hereinafter with reference to FIGS. 1-2Q.

FIG. 1 is a cross sectional view of a semiconductor device 1 in accordance with a first embodiment.

As shown in FIG. 1, a p-MOSFET region 100 and an n-MOSFET region 200 are provided on a semiconductor substrate 2 in the semiconductor device 1. The p-MOSFET region 100 and the n-MOSFET region 200 are electrically isolated by a STI (Shallow Trench Isolation) 3.

In the p-MOSFET region 100, an n type well 101 is provided on the semiconductor substrate 2, a first source/drain region 105 is provided on a surface of the n type well 101, a first silicide layer 106 is provided on the gate/drain region 105, a first gate dielectric layer 103 is provided on the n type well 101, a first gate electrode 102 is provided on the first gate dielectric layer 103, and a first sidewall 104 is provided on the n type well 100 and on a side surface of the first gate electrode 102.

In the n-MOSFET 200, an p type well 201 is provided on the semiconductor substrate 2, a second source/drain region 205 is provided on a surface of the n type well 201, a second silicide layer 206 is provided on the gate/drain region 205, a second gate dielectric layer 203 provided on the p type well 201, a second gate electrode 202 is provided on the second gate dielectric layer 203, and a second sidewall 204 is provided on the p type well 201 and on a side surface of the second gate electrode 202.

The first gate electrode 102 is made of germanide. The first gate electrode 102 may be formed such that a rare earth metal such as Er, Y, Yb or the like is provided on a poly Ge (germanium) or poly SiGe having highly Ge concentration and diffused to the boundary to the first gate dielectric layer 103. The first gate electrode 102 is a fully germanided poly Ge or poly SiGe having a rare earth metal. The effective work function of the first gate electrode 102 is greater than the energy difference (about 4.5 eV) from the vacuum level to the energy at the middle of the band gap of Si. Preferably, the effective work function of the first gate electrode 102 is greater than 4.8 eV such that the threshold voltage of the pMOSFET is lowered and the pMOSFET is driven at low voltage and in a high speed.

The second gate electrode 202 is made of silicide. The second gate electrode 202 may be formed such that a rare earth metal such as Er, Y, Yb or the like is provided on a poly silicon having highly Ge concentration and diffused to the boundary to the second gate dielectric layer 203. The second gate electrode 202 is fully silicided poly silicon having a rare earth metal. The effective work function of the second gate electrode 202 is less than the energy difference (about 4.5 eV)

from the vacuum level to the energy at the middle of the band gap of Si. Preferably, the effective work function of the second gate electrode 202 is less than 4.3 eV such that the threshold voltage of the nMOSFET is lowered and the nMOSFET is driven at low voltage and in a high speed.

The first gate dielectric layer 103 and the second gate dielectric layer 203 have boundary layers 103a, 203a and high dielectric constant layers 103b, 203b on the boundary layers 103a, 203a, which are no less than 8 in relative dielectric constant. The high dielectric constant layers 103b, 203b may be made of a HfO2 or ZrO2 based material such as HfSiON, HfSiO, HfO, ZrSiON, ZrSiO, ZrO, or the like.

The first sidewall 104 and the sidewall 204 may be made of single layered structure which has a dielectric layer such as SiN or the like, two or more than three layered structure which has a plurality of dielectric layers such as SiN, SiO2, TEOS (tetraethoxysilane) or the like.

The first source/drain region 105 may be formed by implanting p type impurities such as B, Bf2, In or the like to the surface of the semiconductor substrate 2.

The second source/drain region 205 may be formed by implanting n type impurities such as As, P or the like to the surface of the semiconductor substrate 2.

The first silicide layer 106 and the second silicide layer 206 may be made of a silicon compound which has a metal such as Ni, Pt, Co, Er, Pd, NiPt, or the like.

Next, a manufacturing process of the semiconductor device 1 will be explained hereinafter with reference to FIGS. 2A-2Q.

Figure 2A:
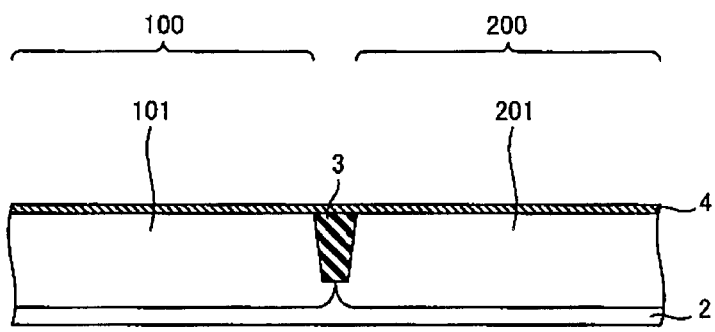
FIGS. 2A-2Q are cross sectional views of a semiconductor device showing a manufacturing process in accordance with a first embodiment.

As shown in FIG. 2A, the STI 3 is formed in the semiconductor substrate 2. A sacrificial oxide layer 4 is formed on the semiconductor substrate 2. The n type well 101 is formed by implanting an n type impurity ion, such as As, P or the like into a semiconductor substrate 2 with a resist pattern (not shown in FIG. 2A) provided on the sacrificial oxide layer 4 as a mask. A p type impurity ion, such as B, BF2, In or the like is implanted into the n type well 101 so as to adjust a threshold of the p-MOSFET region 100 (channel ion implantation). Similar to the n type well 101, the p type well 201 is formed by implanting a p type impurity ion and an n type impurity is implanted in the p type well 201 so as to adjust threshold of the n-MOSFET region 200 (channel ion implantation). After the resist pattern is removed, an RTA (Rapid Thermal Annealing) is provided so as to remove defects in the semiconductor substrate 2 and activate the implanted ions.

Figure 2B:
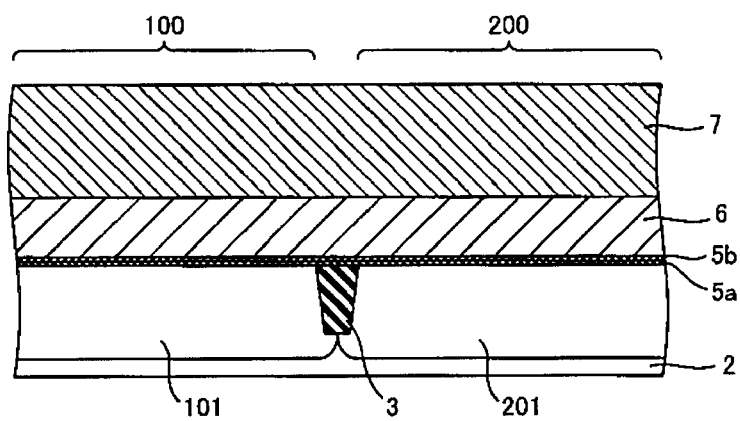

As shown in FIG. 2B, the sacrificial oxide layer 4 is removed by dilute hydrofluoric acid or the like. A oxide layer 5a, which has about 1 nm in thickness and is a SiO2 or the like, and a high dielectric constant layer 5b, which has about 3 nm in thickness and is HfSiON are provided on the semiconductor substrate 2. The SiO2 layer may be formed by a thermal oxidation in 700 Centigrade and low oxide pressure ambient. The HfSiON layer may be formed by introducing 10-15 atom % nitrogen into a HfSiO layer, which is formed by MOCVD (Metal Organic Chemical Vapor Deposition) and annealing.

The polycrystalline silicon layer 6 is formed by thermal CVD on the high dielectric constant layer 5b, and the polycrystalline SiGe layer 7 is formed on the polycrystalline silicon layer 6 by CVD using a mixture gas including SiH4 and GeH4.

Figure 2C:
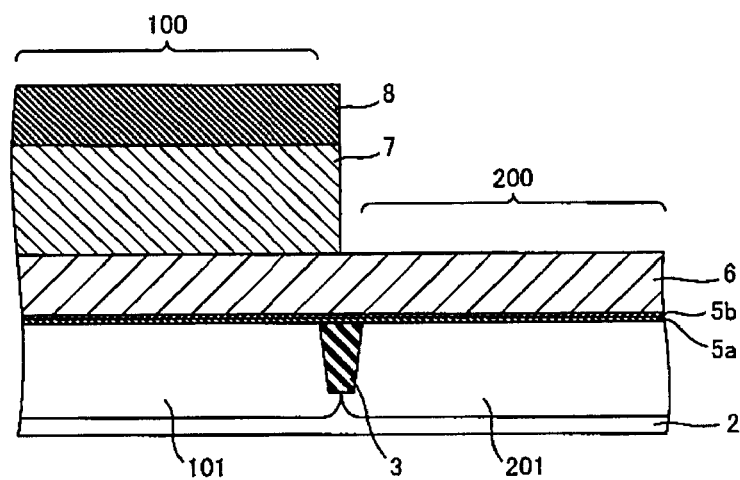

As shown in FIG. 2C, the polycrystalline SiGe layer 7 in the n-MOSFET region 200 is removed by RIE or the like with an SiN mask layer 8, which is patterned by lithography, as a mask.

Figure 2D:
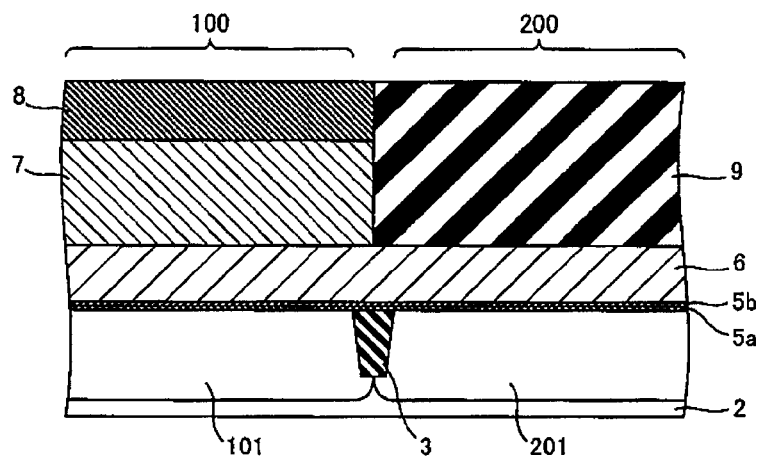
Figure 2E:
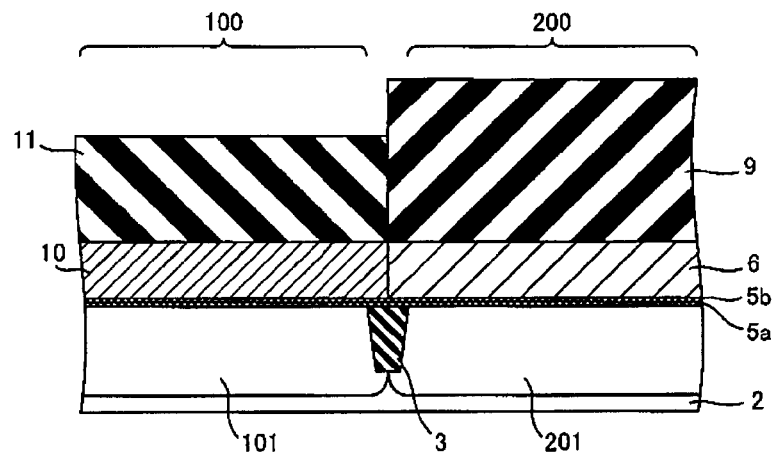

As shown in FIG. 2D, a mask layer 9, which is SiO2 and a TEOS (tetraethyloxysilane) as a raw material gas, is formed on the entire surface of the semiconductor substrate 2 in the p-MOSFET region 100 and n-MOSFET region 200. The mask layer 9 is removed by CMP with the layer 8 as an etch stopper. The mask layer 9, which is formed on the n-MOSFET region 200 before CMP is provided, is preferably 1.2-1.5 times as thick as the sum of the polycrystalline SiGe layer 7 and mask layer 8.

As shown in FIG. 2D, the mask layer 8 is removed by a hot phosphoric acid or the like, and a thermal oxidation is provided in about 800 Centigrade. Thus, the Si in the polycrystalline SiGe layer 7 is selectively oxidized, SiO2 is formed. The Ge in the polycrystalline SiGe layer 7 is diffused to the polycrystalline Si layer 6. The oxidation proceeds, and the polycrystalline Si layer 6 in the p-MOSFET region 100, and the polycrystalline SiGe layer 7 are turned to a polycrystalline Ge layer 10, which has substantially 100 atom % Ge concentration, and an SiO2 layer 11. On the other hand, the polycrystalline Si layer 6 in the n-MOSFET region 200 is hardly oxidized, since the mask layer 9 is provided on the polycrystalline Si layer 6.

The polycrystalline Ge layer 10 in the p-MOSFET region 100 is preferably greater than or equal to the polycrystalline Si layer 6 in n-MOSFET region 200 in thickness. So the thickness of the polycrystalline layer 7 may be adjusted in the process in FIG. 2B.

Figure 2F:
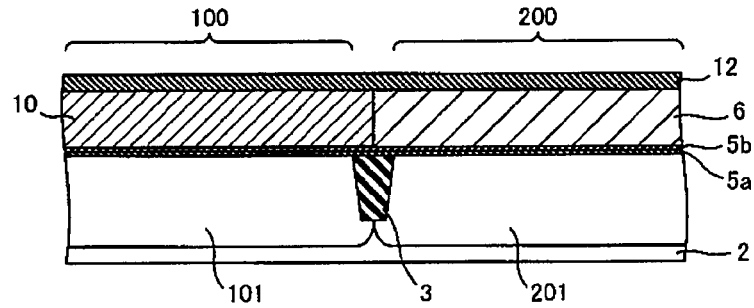

As shown in FIG. 2F, the SiO2 11 in the n-MOSFET region 100 and the mask layer 9 in the p-MOSFET 200 are removed by dilute hydrofluoric acid, and a cap layer 12, which is made of SiN and has about 70 nm thickness, is formed on the polycrystalline SiGe layer 10 in the n-MOSFET region 100 and the polycrystalline Si layer 6 in the p-MOSFET 200.

Figure 2G:
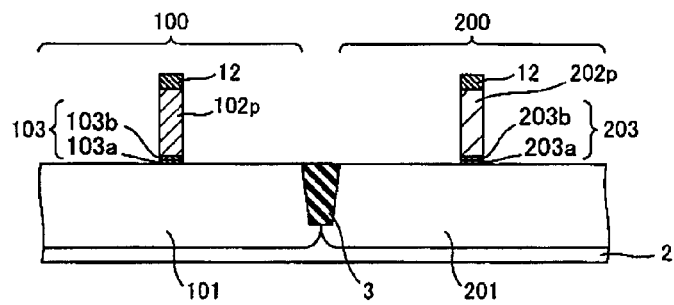

As shown in FIG. 2G, in the n-MOSFET region 100, a first gate electrode pattern 102p and a first gate dielectric layer 103 are formed by lithography, RIE or the like. In the p-MOSFET region 200, a second gate electrode pattern 202p and a second gate dielectric layer 203 are formed by lithography, RIE or the like.

The first gate dielectric layer 103 has the first boundary layer 103a and the first high dielectric layer 103b.

The second gate dielectric layer 203 has the second boundary layer 203a and the second high dielectric layer 203b.

The cap layer 12 is provided on the first gate electrode pattern 102p and the second gate electrode pattern 202p.

The first gate electrode pattern 102p and the second gate electrode pattern 202p may be formed in a single process, since an etchant of the Si and Ge is common. However, the first gate electrode pattern 102p and the second gate electrode pattern 202p may be formed in a different manufacturing process.

Figure 2H:
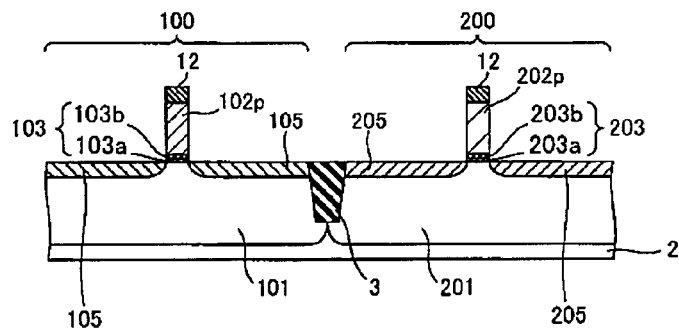

As shown in FIG. 2H, in the p-MOSFET region 100, an extension region of the first source/drain region 105 is formed by implanting p type impurity, and an n type impurity ion such as As, P or the like is implanted to the n type well region 101 below the first gate dielectric layer 103 so as to increase threshold voltage and reduce short channel effect. On the other hand, in the n-MOSFET region 200, an extension region of the second source/drain region 205 is formed by implanting an n type impurity, and a p type impurity ion such as B, BF2, In or the like is implanted to the p type well region 201 below the second gate dielectric layer 203 so as to increase threshold voltage and reduce short channel effect. After that, a spike anneal such as about 800 Centigrade is provided, and the impurity ion is activated.

Figure 2I:
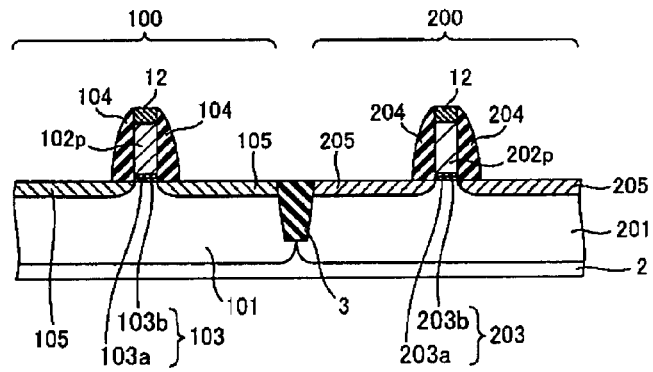

As shown in FIG. 2I, a first gate sidewall 104 and a second gate sidewall 204, which have a laminated TEOS and SiN, are provided on a side of the first gate electrode pattern 102p and the second gate electrode pattern 202p. The sidewalls 104, 204 are formed by etching, such as RIE, a lamination layer which is formed of a 5 nm TEOS and 20 nm SiN in this order. The sidewalls 104, 204 are not limited to the two layered structure. The sidewalls 104, 204 may be a three layered structure made of TEOS, SiN and TEOS, or SiN, TEOS and SiN.

Figure 2J:
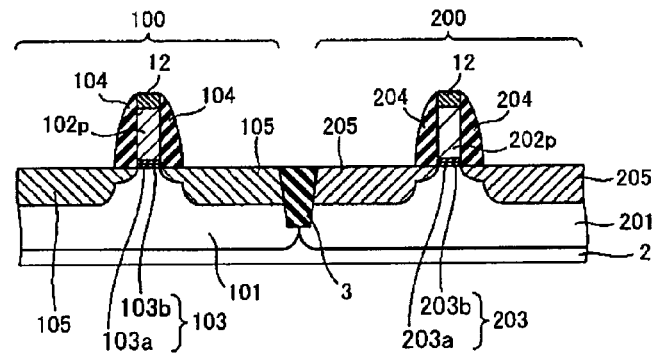

As shown in FIG. 2J, a p type impurity ion is implanted into the semiconductor substrate 2 in the p-MOSFET region 100 with lithography, and an n type impurity ion is implanted into the semiconductor substrate 2 in the n-MOSFET region 200 with lithography. A high temperature short period anneal such as millisecond anneal in no less than 1030 Centigrade is provided, and the defects in the semiconductor substrate 2 are decreased and the impurities are activated. So the first source/drain region 105 and the second source/drain region 205 are formed in the n-MOSFET region 100 and the p-MOSFET region 200, respectively.

Figure 2K:
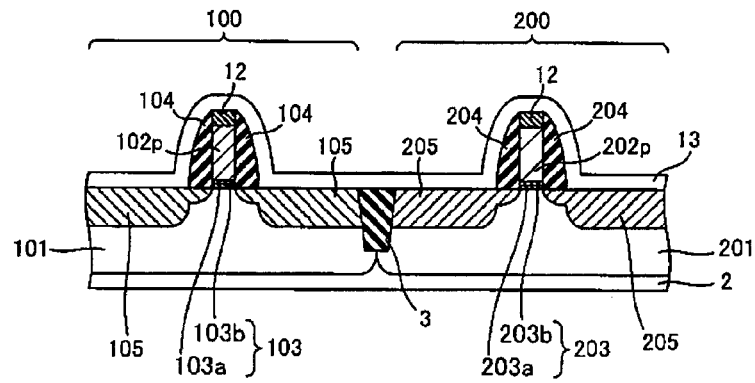

As shown in FIG. 2K, a first metal layer 13 is formed on the entire upper surface of the semiconductor substrate 2 by sputtering. The first metal layer 13 may be Ni, Pt, Co, Er, Pd, NiPt or the like. For example, the first metal layer is about 8 nm in thickness.

Figure 2L:
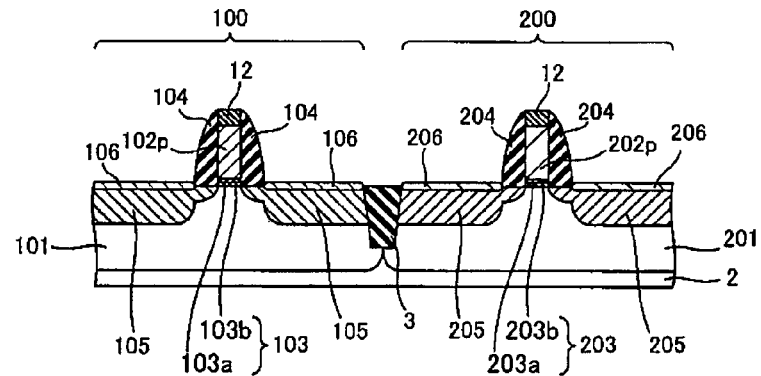

As shown in FIG. 2L, a silicidation process is provided. By providing 430 Centigrade, 30 seconds annealing, a silicidation reaction occurs in a boundary between the first metal 13 and the first source/drain region 105 and a boundary between the first metal 13 and the second source/drain region 205. So the first silicide layer 106 and the second silicide layer 206 are formed on the first source/drain region 105 and the second source/drain region 205, respectively. A residual first metal layer 13, which is not reacted to the source/drain regions 105, 205, is removed by a mixture liquid including sulfuric acid and hydrogen peroxide. The first gate electrode pattern 103p and the second gate electrode pattern 203p does not react with the first metal 13, since the cap layers 12 are provided on the gate electrode patterns 103p, 203p.

The metal in the first silicide layer 105 may be different from the metal in the second silicide layer 205. The metal in the first silicide layer 105 is a rare metal silicide such as Pt silicide, and the metal in the second silicide layer 205 is a rare earth metal silicide such as Er silicide. In such case, the metal on the n-MOSFET 100 is different from the metal on the p-MOSFET 200 and formed in a different manufacturing process.

Figure 2M:
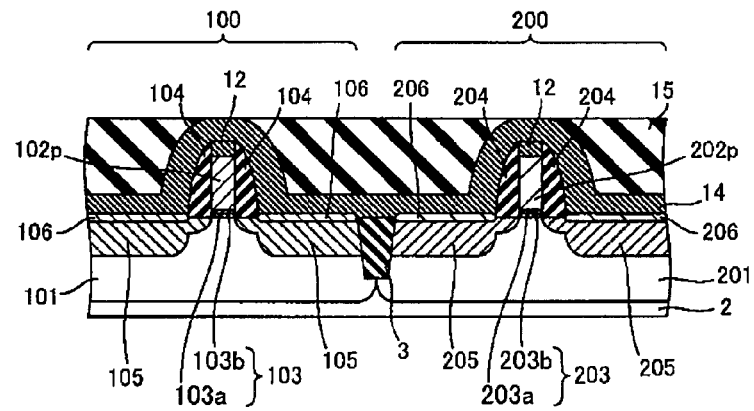

As shown in FIG. 2M, a first dielectric layer 14, which is made of 30 nm thickness SiN, and a second dielectric layer 15, which is made of 100 nm thickness SiO2, are formed on the entire upper surface in this order. The first dielectric layer 14 and the second dielectric layer 15 are formed by plasma CVD using HCD plasma source. The second dielectric layer 15 is removed by CMP so as to expose the first dielectric layer 14 with the first dielectric layer 14 as a stopper. The first dielectric layer 14 has preferably same level etching endurance as the cap layer 12. The first dielectric layer 14 has different etching endurance from the second dielectric layer 15.

Figure 2N:
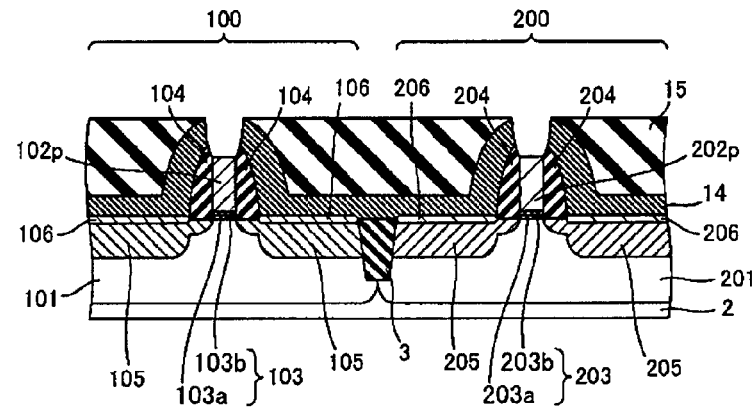

As shown in FIG. 2N, the exposed part of the second dielectric layer 14 is removed by a hot phosphoric acid, and the first gate electrode pattern 102p in the p-MOSFET region 100 and the second gate electrode pattern 202p in the n-MOSFET region 200 are exposed.

Figure 2O:
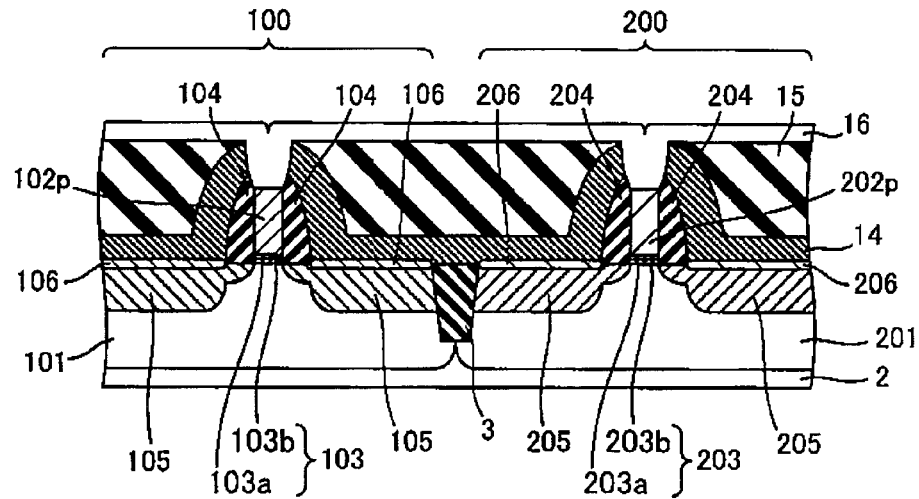

As shown in FIG. 2O, a rare earth metal such as Er is formed on the second dielectric layer 15, the first gate electrode pattern 102p and the second gate electrode pattern 202p by sputtering. So the second metal layer 16, which has about 50 nm in thickness, is formed.

Figure 2P:
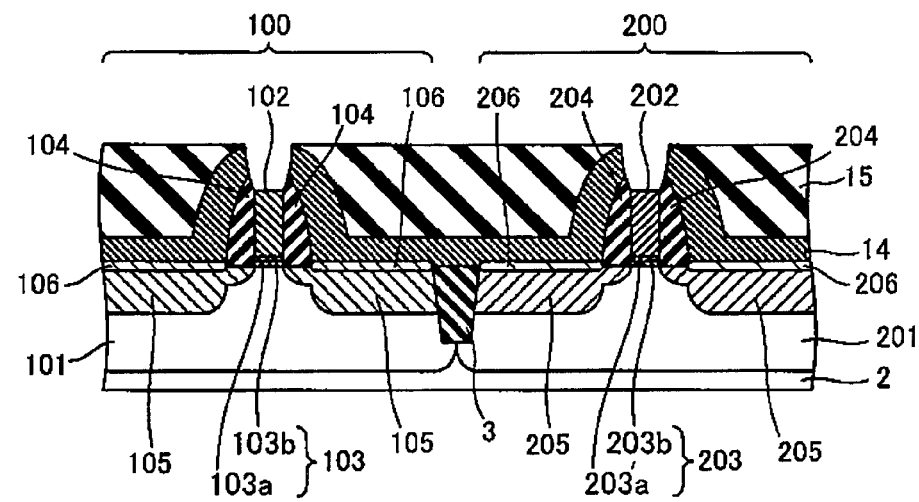

As shown in FIG. 2P, in p-MOSFET region 100, a first gate electrode 102 is formed by annealing in about 450 Centigrade. A germanide reaction occur from the boundary between the second metal layer 16 and the first gate electrode pattern 102p, which has Ge. The annealing is provided such that a part of the gate electrode pattern 102p which is in contact with the first gate dielectric layer 103 is germanided. So the first gate electrode 102 which is fully germanided rare earth metal gate is provided. On the other hand, in the n-MOSFET region 200, a second gate electrode 202 is formed by annealing in about 450 Centigrade. A silicide reaction occur from the boundary between the second metal layer 16 and the second gate electrode pattern 202p, which has Si element. The annealing is provided such that a part of the gate electrode pattern 202p which is in contact with the first gate dielectric layer 203 is silicided. So the second gate electrode 202 which is fully silicided rare earth metal gate is provided. A part of the metal layer 16, which does not react with the first gate electrode pattern 102p and the second gate electrode pattern 202p is removed by sulfuric acid and hydrogen peroxide.

Figure 2Q:
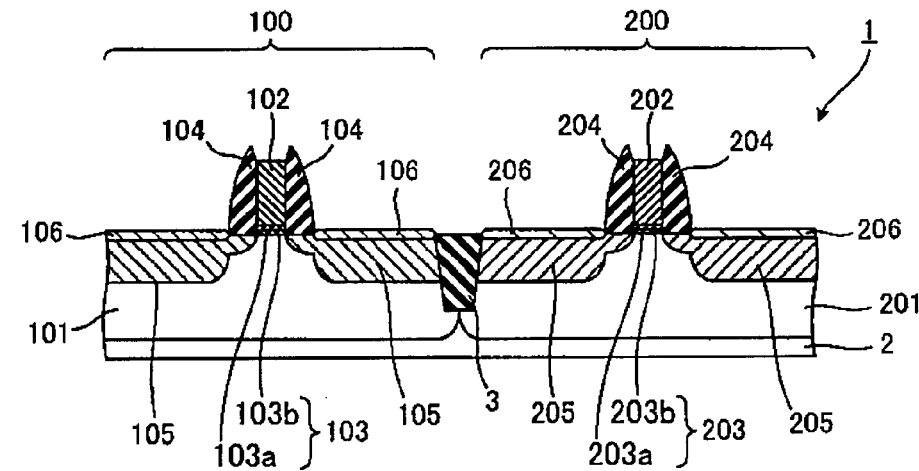

As shown in FIG. 2Q, the first dielectric layer 14 and the second dielectric layer 15 are removed by etching. So the semiconductor device 1 as shown in FIG. 1 is provided. After that, an inter layer dielectric layer, a contact, a wiring or the like (not shown in the figures) is provided. The first dielectric layer 14 and the second dielectric layer 15 may be used as an etch stopper or the inter layer dielectric layer, instead of removing them.

In this first embodiment, the germanide gate electrode on the high dielectric constant gate dielectric layer in the p-MOSFET and the silicide gate electrode on the high dielectric constant gate dielectric layer in the n-MOSFET have the common rare earth metal. So the germanide gate electrode and the silicide gate electrode have suitable effective work function for the p-MOSFET and n-MOSFET, respectively.

The high dielectric constant gate dielectric layer may be HfO2 or ZrO2 based high dielectric constant layer.

The gate depletion may be reduced, since the fully germanided gate electrode is used as the first gate electrode 102 and the fully silicided gate electrode is used as the second gate electrode.

The gate leakage current may be reduced, since the high dielectric constant gate dielectric layer is used in the gate dielectric layer 103.

Second Embodiment

A second embodiment is explained with reference to FIGS. 3A-3C.

In this second embodiment, a manufacturing process of the semiconductor device is different from that in the first embodiment.

The process as shown in FIG. 2A is the same as the process in this embodiment.

Figure 3A:
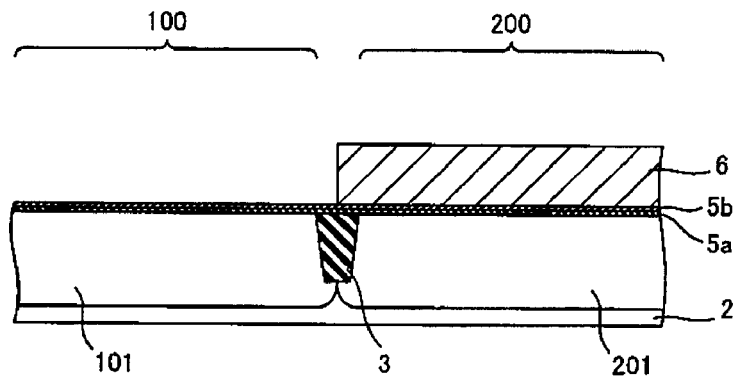
FIGS. 3A-3C are cross sectional views of a semiconductor device showing a manufacturing process in accordance with a second embodiment.

As shown in FIG. 3A, the sacrificial oxide layer 4 is removed by dilute hydrofluoric acid or the like. An oxide layer 5a and a high dielectric constant layer 5b are provided on the semiconductor substrate 2. The polycrystalline silicon layer 6 is formed by thermal CVD on the high dielectric constant layer 5b, and the polycrystalline silicon layer 6 in the p-MOSFET region 100 is removed by lithography, RIE or the like.

Figure 3B:
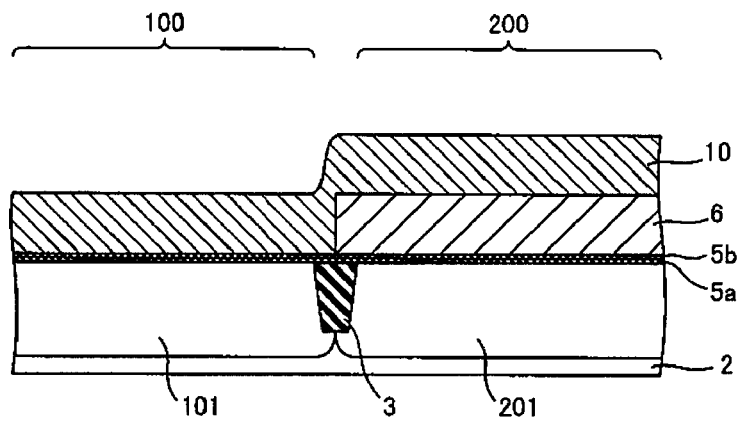

As shown in FIG. 3B, the polycrystalline Ge layer 10 is formed by CVD or the like on the entire surface of the semiconductor substrate 2.

Figure 3C:
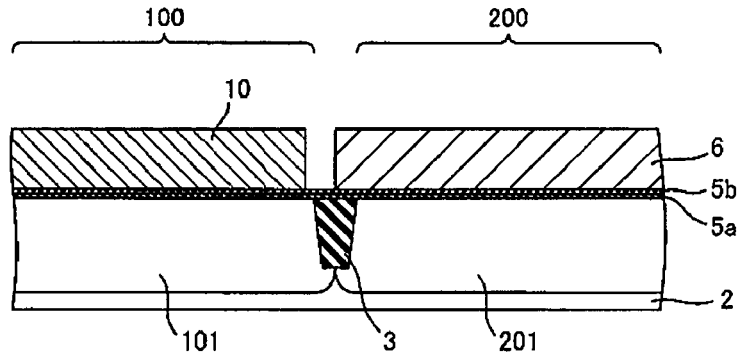

As shown in FIG. 3C, the polycrystalline Ge layer 10 in the n-MOSFET region 200 is removed by lithography, RIE or the like.

After that, as shown in FIG. 2G, the first dielectric layer 103, the first gate electrode pattern 102p and the cap layer 12 are formed in the p-MOSFET region 100, and the second dielectric layer 203, the second gate electrode pattern 202p and the cap layer 12 are formed in the n-MOSFET region 200. After that, the process shown in FIGS. 2H-2Q is provided and the semiconductor device 1 as shown in FIG. 1 is provided.

In this second embodiment, the polycrystalline Ge layer 10 is used. So the process of forming polycrystalline Ge layer 10 by thermal oxidizing the polycrystalline SiGe layer 7 and the polycrystalline Si layer 6 is omitted. So the manufacturing process may be shortened as comparing to the process shown in the first embodiment.

Third Embodiment

A third embodiment is explained with reference to FIGS. 4A-4K.

In this third embodiment, a manufacturing process of the semiconductor device is different from that in the first embodiment.

Figure 4A:
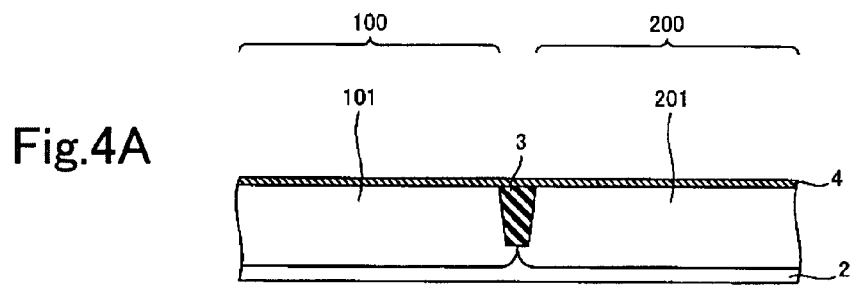
FIGS. 4A-4K are cross sectional views of a semiconductor device showing a manufacturing process in accordance with a third embodiment.

As shown in FIG. 4A, the STI 3 is formed in the semiconductor substrate 2. A sacrificial oxide layer 4 is formed on the semiconductor substrate 2. The n type well 101 and the p type well 201 are formed in the p-MOSFET region 100 and the n-MOSFET region 200, respectively. This process is the same that as shown in FIG. 2A in the first embodiment.

Figure 4B:
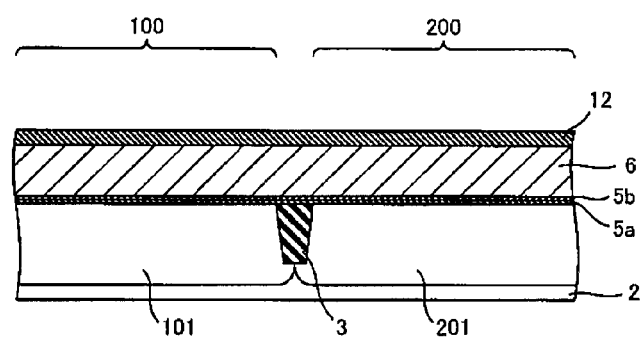

As shown in FIG. 4B, the sacrificial oxide layer 4 is removed by dilute hydrofluoric acid or the like. An oxide layer 5a and a high dielectric constant layer 5b are provided on the semiconductor substrate 2. The polycrystalline silicon layer 6 is formed by thermal CVD on the high dielectric constant layer 5b. The cap layer 12 which has about 70 nm thickness SiN is provided on the polycrystalline silicon layer 6.

Figure 4C:
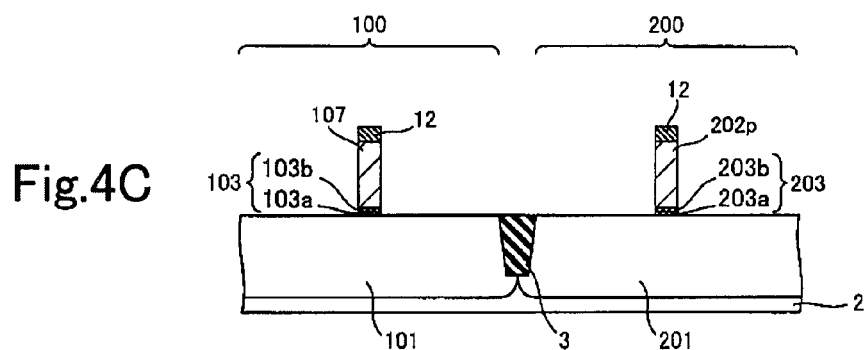

As shown in FIG. 4C, in the p-MOSFET region 100, the first dielectric layer 103 which has the boundary layer 103a and the high dielectric constant layer 103b, a first dummy gate electrode 107, which is made of polycrystalline Si, and the cap layer 12 are formed by lithography, RIE or the like. In the n-MOSFET region 200, the second dielectric layer 203 which has the boundary layer 203a and the high dielectric constant layer 203b, a second dummy gate electrode 207, which is made of polycrystalline Si, and the cap layer 12 are formed by lithography, RIE or the like.

Figure 4D:
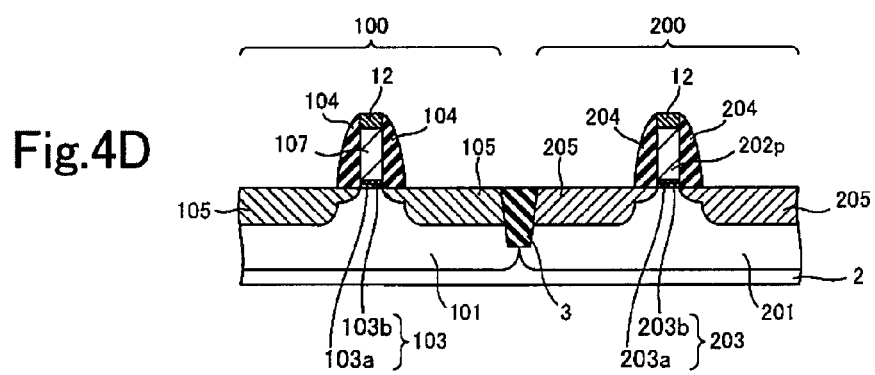

As shown in FIG. 4D, the first source/drain region 105 is formed in the p-MOSFET region 100 by implanting a p type impurity, and the second source/drain region 205 is formed in the n-MOSFET region 200 by implanting an n type impurity. The first sidewall 104 and the second sidewall 204 are formed on the side of the first dummy gate 107 and the second dummy gate 207, respectively.

Figure 4E:
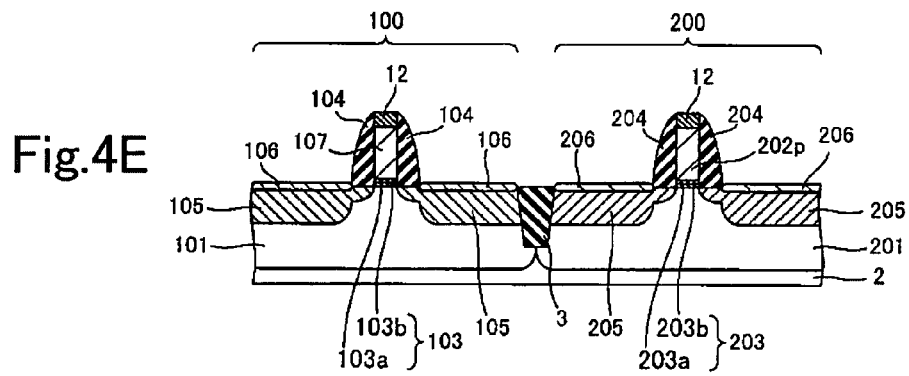

As shown in FIG. 4E, a metal layer, such as Ni, Pt, Co, Er, Pd, NiPt or the like, is formed on the entire upper surface of the semiconductor substrate 2 by sputtering. After that, a silicidation process is provided by annealing. So the first silicide layer 106 and the second silicide layer 206 are formed on the first source/drain region 105 and the second source/drain region 205, respectively. A residual first metal layer 13, which does not reacted with the source/drain regions 105, 205, is removed by a mixture liquid including sulfuric acid and hydrogen peroxide.

Figure 4F:
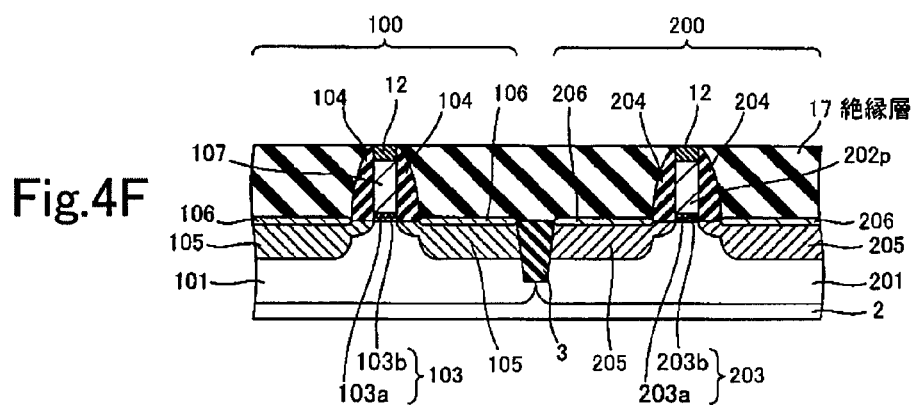

As shown in FIG. 4F, a dielectric layer 17 is formed on the entire upper surface by plasma CVD using HCD plasma source. The dielectric layer 17 is removed by CMP so as to expose the cap layer 12 with the cap layer 12 as a stopper. The dielectric layer 17 has different etching endurance from the cap layer 12 and the first dummy gate 107.

Figure 4G:
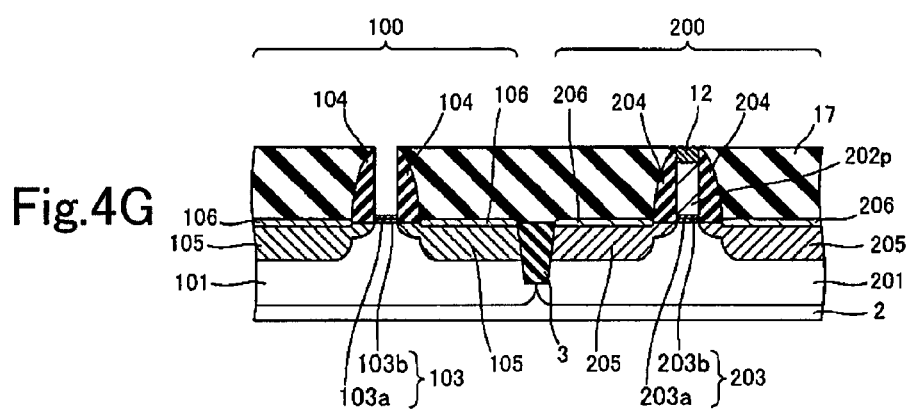

As shown in FIG. 4G, in the p-MOSFET region 100, the cap layer 12 and the first dummy gate 107 are removed by lithography and etching, and the first gate dielectric layer 103 is exposed.

Figure 4H:
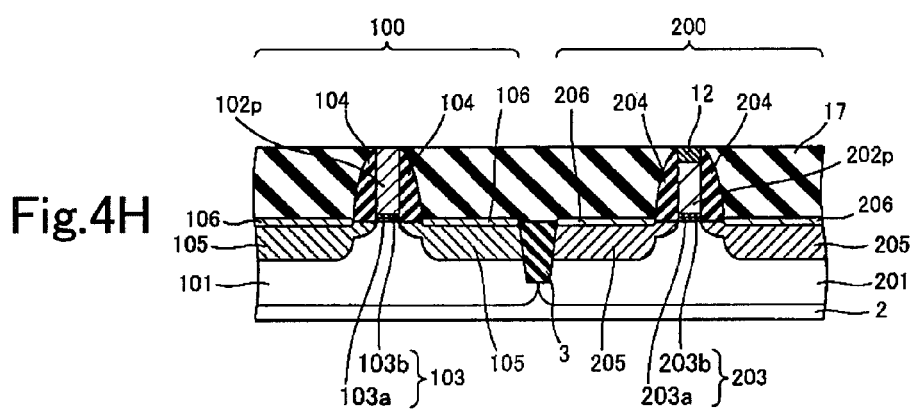

As shown in FIG. 4H, a first gate electrode pattern 102p, which is made of polycrystalline Ge, is formed in a trench provided between the first sidewalls 104. The first gate electrode pattern 102p may be formed by forming the polycrystalline Ge on the entire upper surface and providing CMP so as to expose the cap layer in the n-MOSFET region 200.

Figure 4I:
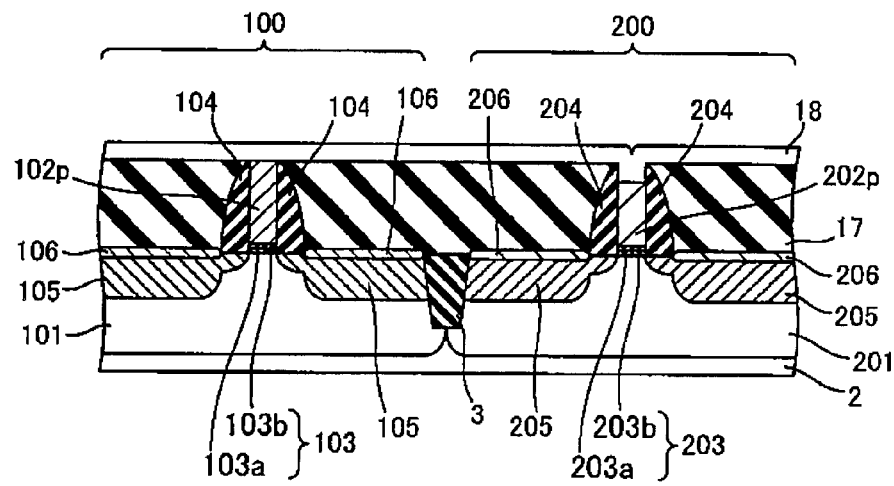

As shown in FIG. 4I, a metal layer, which is made of a rare earth metal such as Er, is formed on the entire upper surface by sputtering. The metal layer 18 may be about 50 nm in thickness.

Figure 4J:
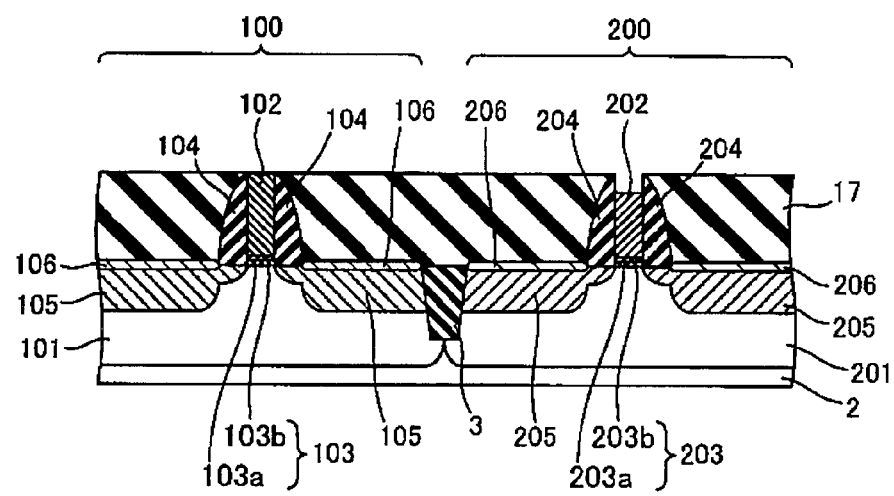

As shown in FIG. 4J, a germanide process is provided. In p-MOSFET region 100, a first gate electrode 102 is formed by annealing. A germanide reaction occurs from the boundary between the second metal layer 16 and the first gate electrode pattern 102p, which has Ge. The annealing is provided such that a part of the gate electrode pattern 102p which is in contact with the first gate dielectric layer 103 is germanided. So the first gate electrode 102 which is fully germanided rare earth metal gate is provided.

On the other hand, in the n-MOSFET region 200, a second gate electrode 202 is formed by annealing. A silicide reaction occurs from the boundary between the second metal layer 18 and the second gate electrode pattern 202p, which has Si. The annealing is provided such that a part of the gate electrode pattern 202p which is in contact with the first gate dielectric layer 203 is silicided. So the second gate electrode 202 which is fully silicided rare earth metal gate is provided.

A part of the metal layer 18, which does not react with the first gate electrode pattern 102p and the second gate electrode pattern 202p, is removed by sulfuric acid and hydrogen peroxide.

Figure 4K:
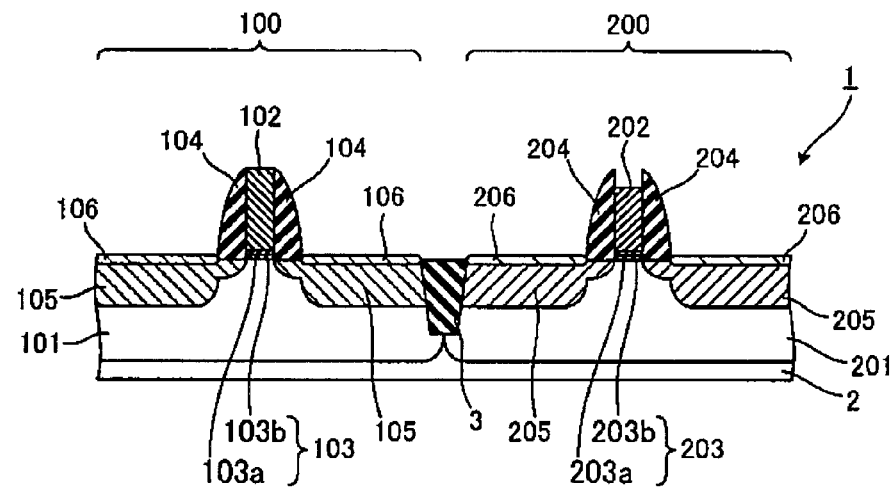

As shown in FIG. 4K, the dielectric layer 17 is removed by etching. So the semiconductor device 1 as shown in the first embodiment is provided.

In this third embodiment, the polycrystalline Si layer 6 is provided and patterned, and the first dummy gate electrode 107 is provided, and the first gate electrode 102 which is made of polycrystalline Ge layer is provided. However, the polycrystalline Ge layer is provided and patterned in the p-MOSFET region 100, and the second dummy gate electrode is provided in the n-MOSFET region 200, and the second gate electrode 202 which is made of polycrystalline Si layer is provided.

Fourth Embodiment

A fourth embodiment is explained with reference to FIGS. 5A-5L.

In this fourth embodiment, a manufacturing process of the semiconductor device is different from that in the first embodiment.

Figure 5A:
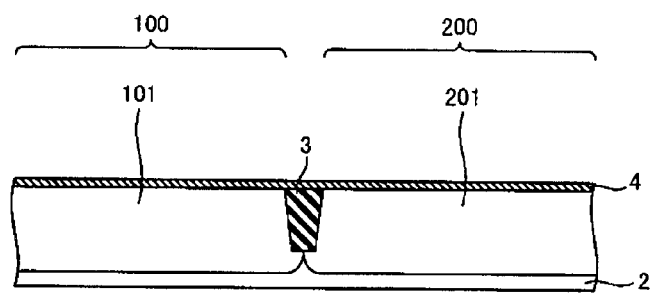
FIGS. 5A-5M are cross sectional views of a semiconductor device showing a manufacturing process in accordance with a fourth embodiment.

As shown in FIG. 5A, the STI 3 is formed in the semiconductor substrate 2. A sacrificial oxide layer 4 is formed on the semiconductor substrate 2. The n type well 101 and the p type well 201 are formed in the p-MOSFET region 100 and the n-MOSFET region 200, respectively. This process is the same that as shown in FIG. 2A in the first embodiment.

Figure 5B:
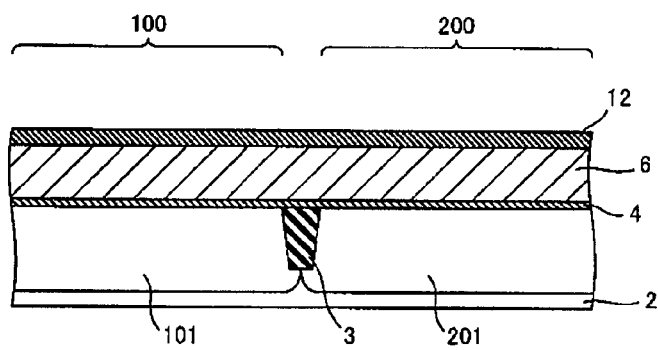

As shown in FIG. 5B, a polycrystalline Si layer 6 is formed on the sacrificial oxide layer 4 and the SiN cap layer 12 is formed on the polycrystalline Si layer 6.

Figure 5C:
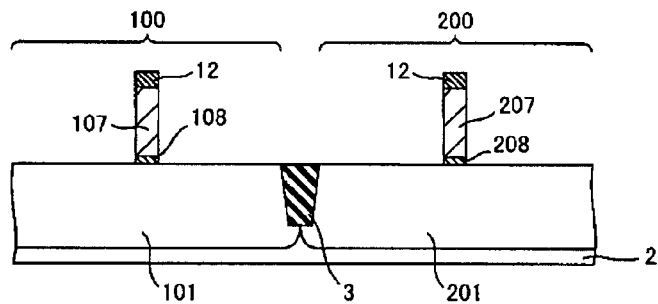

As shown in FIG. 5C, in the p-MOSFET region 100, the cap layer 12, the first dummy gate 107 and a first dummy dielectric layer 108 is formed by lithography and RIE or the like. In the n-MOSFET region 200, the cap layer 12, the second dummy gate 207 and a second dummy dielectric layer 208 is formed by lithography and RIE or the like.

Figure 5D:
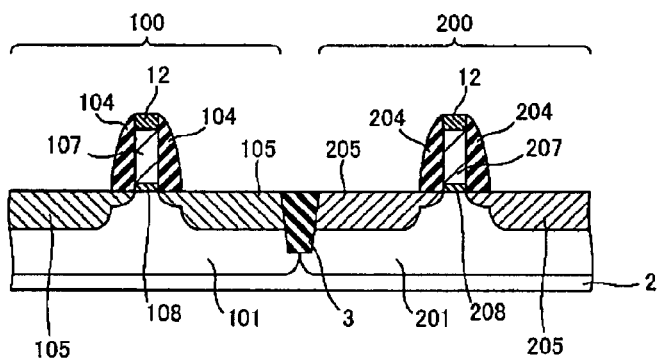

As shown in FIG. 5D, the first source/drain region 105 is formed in the p-MOSFET region 100 by implanting a p type impurity, and the second source/drain region 205 is formed in the n-MOSFET region 200 by implanting an n type impurity. The first sidewall 104 and the second sidewall 204 are formed on the side of the first dummy gate 107 and the second dummy gate 207, respectively.

Figure 5E:
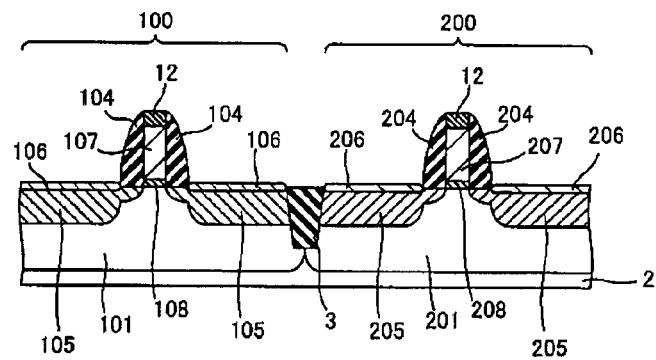

As shown in FIG. 5E, a metal layer, such as Ni, Pt, Co, Er, Pd, NiPt or the like, is formed on the entire upper surface of the semiconductor substrate 2 by sputtering. After that, a silicidation process is provided by annealing. So the first silicide layer 106 and the second silicide layer 206 are formed on the first source/drain region 105 and the second source/drain region 205, respectively. A residual first metal layer 13, which does not react with the source/drain regions 105, 205, is removed by a mixture liquid including sulfuric acid and hydrogen peroxide.

Figure 5F:
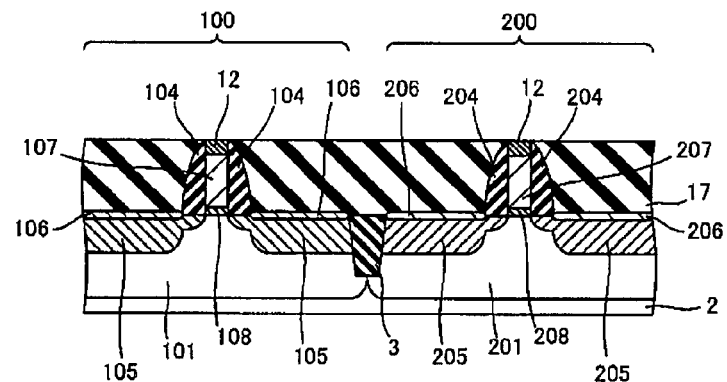

As shown in FIG. 5F, a dielectric layer 17 is formed on the entire upper surface by plasma CVD using HCD plasma source. The dielectric layer 17 is removed by CMP so as to expose the cap layer 12 with the cap layer 12 as a stopper. The dielectric layer 17 has different etching endurance from the cap layer 12, the first dummy gate 107 and the second dummy gate 207.

Figure 5G:
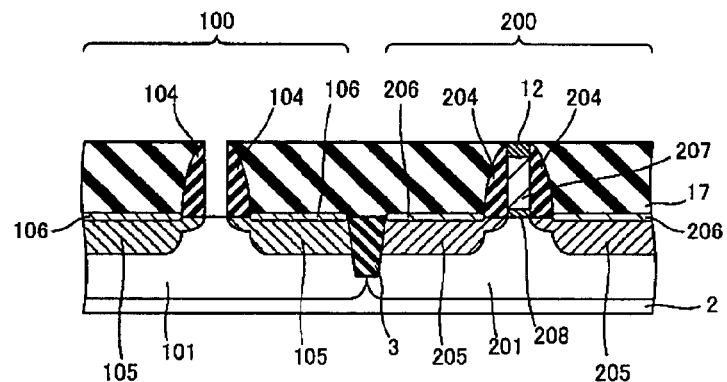

As shown in FIG. 5G, in the p-MOSFET region 100, the cap layer 12, the first dummy gate 107 and the first dummy gate dielectric layer 108 are removed by lithography and etching, and the semiconductor substrate 2 is exposed between the first sidewalls 104.

Figure 5H:
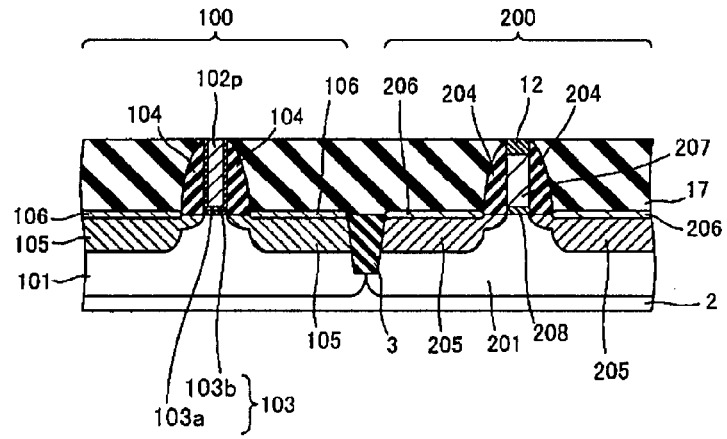

As shown in FIG. 5H, a first boundary layer 103a is formed in a trench provided between the first sidewalls 104. Later that, a high dielectric constant layer 103b is formed on the first boundary layer 103a in a trench provided between the first sidewalls 104 by MOCVD or ALD (Atomic Layer Deposition). The high dielectric constant layer 103b may be HfSiO or the like. The high dielectric constant layer 103b is formed on the inner surface of the sidewall 104. Later that, the first gate electrode pattern 102p, which is made of the polycrystalline Ge, is formed in the trench. The first gate electrode pattern 102p may be formed by providing the polycrystalline Ge on the entire upper surface and providing CMP so as to expose the cap layer in the n-MOSFET region 200.

Figure 5I:
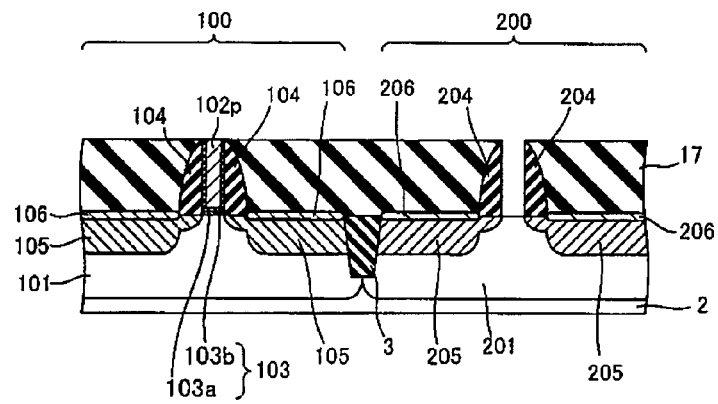

As shown in FIG. 5I, in the n-MOSFET region 200, the cap layer 12, the second dummy gate 207 and the second dummy gate dielectric layer 208 are removed by lithography and etching, and the semiconductor substrate 2 is exposed between the second sidewalls 204.

Figure 5J:
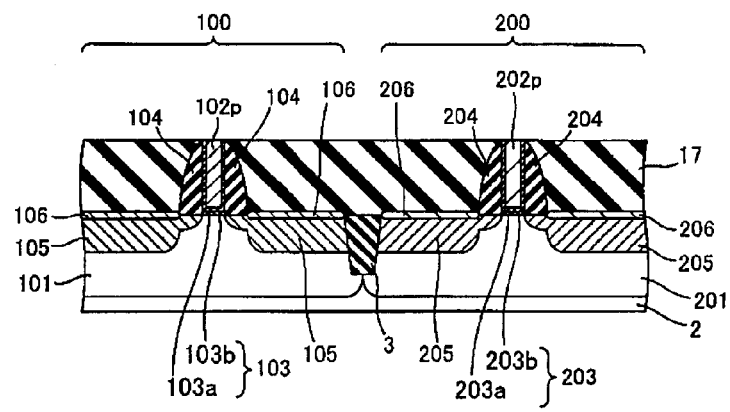

As shown in FIG. 5J, a second boundary layer 203a is formed in a trench provided between the second sidewalls 204. Later that, a high dielectric constant layer 203b is formed on the second boundary layer 203a in a trench provided between the second sidewalls 204 by MOCVD or ALD (Atomic Layer Deposition). The high dielectric constant layer 203b may be HfSiO or the like. The high dielectric constant layer 203b is formed on the inner surface of the second sidewall 204. Later that, the second gate electrode pattern 202p, which is made of the polycrystalline Si, is formed in the trench. The second gate electrode pattern 202p may be formed by providing the polycrystalline Si on the entire upper surface and providing CMP so as to expose the first gate electrode pattern 102p in the p-MOSFET region 100.

In this fourth embodiment, it may be not necessary that nitrogen atom is introduced into the HfSiO layer and the gate dielectric layers 103, 203 have HfSiON layer. Nitrogen is introduced so as to prevent the HfSiO layer from being crystallized during annealing for the source/drain region 105 and 205. However, in this fourth embodiment, the source/drain region 105 and 205 are formed after the first gate dielectric layer 103 and the second gate dielectric 203 are formed.

Figure 5K:
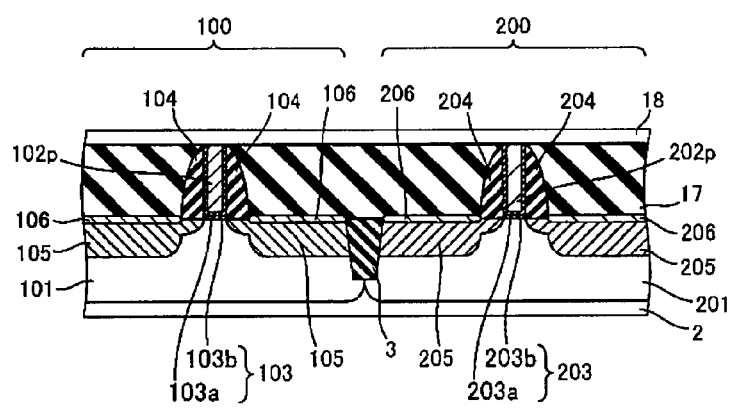

As shown in FIG. 5K, a metal layer 18, which is made of a rare earth metal such as Er, is formed on the entire upper surface by sputtering. The metal layer 18 may be about 50 nm in thickness.

Figure 5L:
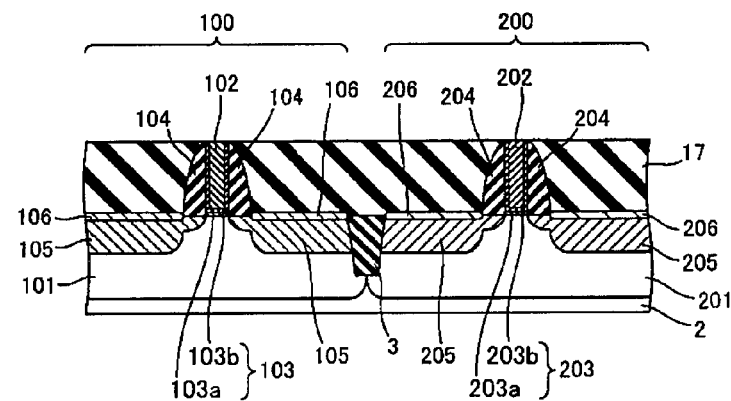

As shown in FIG. 5L, a germanide process is provided. In p-MOSFET region 100, a first gate electrode 102 is formed by annealing. A germanide reaction occurs from the boundary between the second metal layer 18 and the first gate electrode pattern 102p, which has Ge. The annealing is provided such that a part of the gate electrode pattern 102p which is in contact with the first gate dielectric layer 103 is germanided. So the first gate electrode 102 which is fully germanided rare earth metal gate is provided.

On the other hand, in the n-MOSFET region 200, a second gate electrode 202 is formed by annealing. A silicide reaction occurs from the boundary between the second metal layer 18 and the second gate electrode pattern 202p, which has Si. The annealing is provided such that a part of the gate electrode pattern 202p which is in contact with the first gate dielectric layer 203 is silicided. So the second gate electrode 202 which is fully silicided rare earth metal gate is provided.

A part of the metal layer 18, which does not react with the first gate electrode pattern 102p and the second gate electrode pattern 202p, is removed by sulfuric acid and hydrogen peroxide.

Figure 5M:
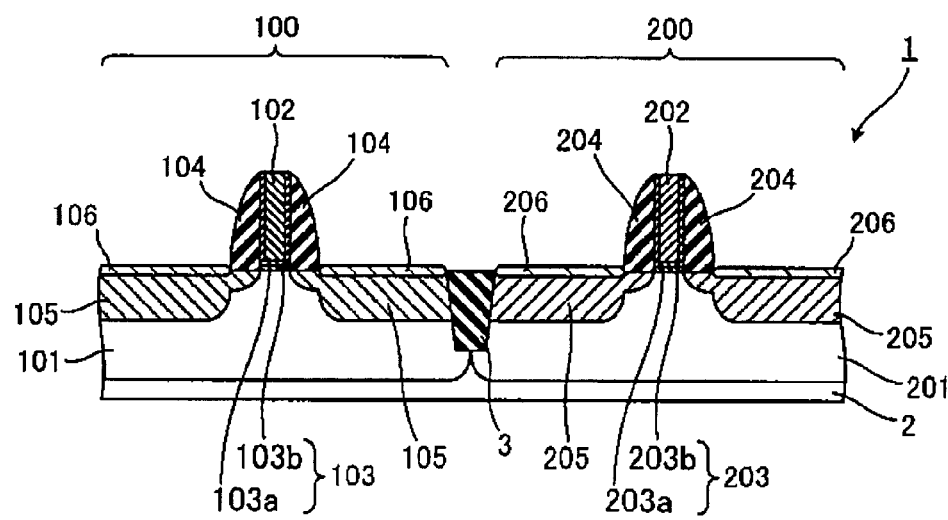

As shown in FIG. 5M, the dielectric layer 17 is removed by etching. So the semiconductor device 1 as shown in the first embodiment is provided.

In this fourth embodiment, the first gate dielectric layer 103 and the first gate electrode pattern 102p in the p-MOSFET region 100 are formed before the second gate dielectric layer 203 and the second gate electrode pattern 202p in the n-MOSFET region 100 are formed. However, the second gate dielectric layer 203 and the second gate electrode pattern 202p in the n-MOSFET region 100 may be formed, before the first gate dielectric layer 103 and the first gate electrode pattern 102p in the p-MOSFET region 100 are formed.

Figure 6:
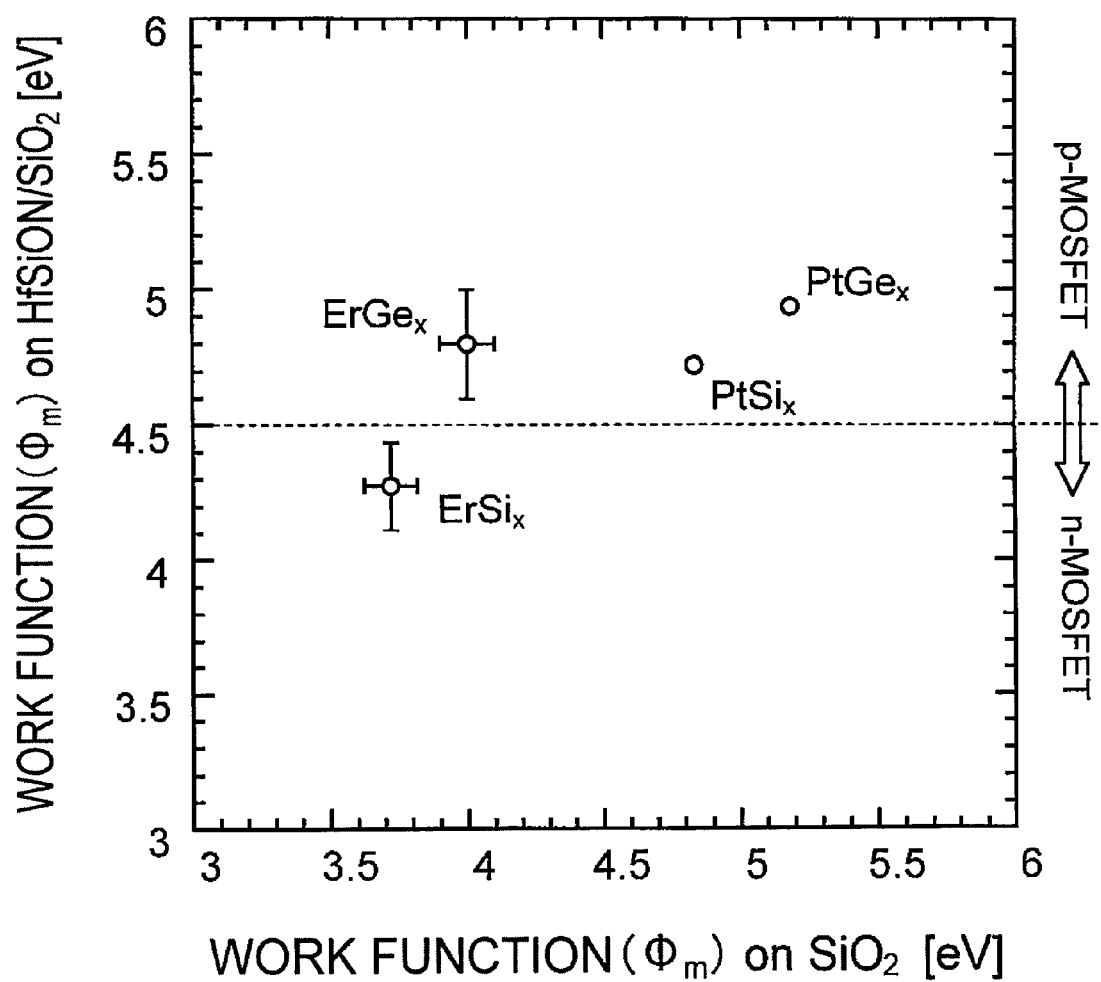
FIG. 6 is a graph showing measured values of an effective work function of a gate electrode in accordance with the embodiments.

FIG. 6 is a graph showing measured values of an effective work function of a gate electrode in accordance with the embodiments.

The effective work function of a first gate electrode 102 and the second gate electrode 202 is measured.

In FIG. 6, the vertical axis is the effective work function Φm in case the gate dielectric layer has a boundary layer made of SiO2 and a high dielectric constant layer made of HfSiON. The horizontal axis is the effective work function Φm in case the gate dielectric layer is a single layered SiO2, as a comparative example.

ErGex and ErSix are a fully germanided gate electrode and a fully silicided gate electrode, respectively. In the fully germanided gate electrode, the rare earth metal is diffused to the boundary to the gate dielectric layer and the poly silicon germanium is germanided. In the fully silicided gate electrode, the rare earth metal is diffused to the boundary to the gate dielectric layer and the poly silicon is silicided. The fully germanided gate electrode is corresponding to the first gate electrode 102, and the fully silicided gate electrode is corresponding to the second gate electrode 202.

PtGex and PtSix are the germanide and silicide in which a non rare earth metal is diffused as a comparative example.

In case the effective work function of the gate electrode is greater than the energy difference (about 4.5 eV) from the vacuum level to the energy at the middle of the band gap of Si, the gate electrode is suitable to p-MOSFET. In case the effective work function of the gate electrode is less than the energy difference (about 4.5 eV) from the vacuum level to the energy at the middle of the band gap of Si, the gate electrode is suitable to n-MOSFET.

As shown in FIG. 6, on the gate dielectric layer having two layered structure SiO2 and HfSiON, ErGex is suitable for gate electrode in p-MOSFET, and ErSix is suitable for gate electrode in n-MOSFET.

On contrary, on the gate dielectric layer having two layered structure SiO2 and HfSiON, PtGex and PtSix are suitable for the gate electrode in the p-MOSFET. So it is difficult to form an n-MOSFET having a Pt silicide and a p-MOSFET having a Pt germanide in a semiconductor substrate 2.

Thus, on the high dielectric constant layer, the rare earth metal germanide is suitable for p-MOSFET and the rare earth metal silicide is suitable for n-MOSFET.

Embodiments of the invention have been described with reference to the examples. However, the invention is not limited thereto.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor device, comprising:
   a semiconductor substrate;
   a first gate dielectric layer provided on the semiconductor substrate, the relative dielectric constant ratio of the first gate dielectric layer being no less than 8;
   a second gate dielectric layer provided on the semiconductor substrate, the relative dielectric constant ratio of the second gate dielectric layer being no less than 8;
   a first gate electrode provided on the first gate dielectric layer and made of germanide which is a metallic compound containing a metal element of a rare earth metal; and
   a second gate electrode provided on the second gate dielectric layer and made of silicide which is a metallic compound containing the same metal element of a rare earth metal as the germanide in the first gate electrode.

2. A semiconductor device of claim 1, wherein a first gate dielectric layer and the second gate dielectric layer have at least one of Hf and Zr.

3. A semiconductor device of claim 1, wherein the metal element in silicide and germanide is Er.

4. A semiconductor device of claim 3, wherein each of the first gate dielectric layer and the second gate dielectric layer has a two layered structure having an HfSiON layer and an SiO2 layer, and the HfSiON layer is in contact with the first gate electrode and the second gate electrode, respectively.

5. A semiconductor device of claim 1, wherein each of the first gate dielectric layer and the second gate dielectric layer has a two layered structure having an HfSiON layer and an SiO2 layer, and the HfSiON layer is in contact with the first gate electrode and the second gate electrode, respectively.

6. A semiconductor device of claim 1, further comprising, a sidewall provided a side of the first gate electrode and the second gate electrode, being made of dielectric; and
   wherein the first gate dielectric layer is provided between the first gate electrode and the sidewall, and the second gate dielectric layer is provided between the second gate electrode and the sidewall.

\* \* \* \* \*